(12) United States Patent
Downes et al.

(10) Patent No.: US 7,159,758 B1
(45) Date of Patent: Jan. 9, 2007

(54) CIRCUIT BOARD PROCESSING TECHNIQUES USING SOLDER FUSING

(75) Inventors: Stuart D. Downes, Milford, MA (US); Larry Norris, Boston, MA (US); Jin Liang, Southborough, MA (US)

(73) Assignee: EMC Corporation, Hopkinton, MA (US)

( * ) Notice: Subject to any disclaimer, the term of this patent is extended or adjusted under 35 U.S.C. 154(b) by 212 days.

(21) Appl. No.: 10/607,400

(22) Filed: Jun. 26, 2003

(51) Int. Cl.
*B23K 31/02* (2006.01)
(52) U.S. Cl. .................................. 228/248.1
(58) Field of Classification Search ............. 228/248.1, 228/33, 25, 205, 206, 214, 203, 22
See application file for complete search history.

(56) References Cited

U.S. PATENT DOCUMENTS

| | | | | |
|---|---|---|---|---|
| 2,933,412 A | * | 4/1960 | Thayer, Jr. | 427/123 |
| 4,772,935 A | * | 9/1988 | Lawler et al. | 257/751 |
| 5,269,453 A | * | 12/1993 | Melton et al. | 228/180.22 |
| 5,296,649 A | * | 3/1994 | Kosuga et al. | 174/250 |
| 5,452,842 A | * | 9/1995 | Melton et al. | 228/180.22 |
| 5,866,475 A | * | 2/1999 | Yanagida | 438/613 |
| 6,347,734 B1 | | 2/2002 | Downes | 228/180.21 |
| 6,376,279 B1 | * | 4/2002 | Kwon et al. | 438/113 |
| 6,386,435 B1 | | 5/2002 | Downes | 228/248.1 |
| 6,637,641 B1 | | 10/2003 | Downes et al. | 228/102 |
| 6,736,308 B1 | | 5/2004 | Downes | 228/248.1 |
| 6,825,742 B1 | | 11/2004 | Luque | 333/204 |
| 6,845,556 B1 | | 1/2005 | Liang | 29/840 |

* cited by examiner

*Primary Examiner*—Jonathan Johnson
(74) *Attorney, Agent, or Firm*—BainwoodHuang

(57) ABSTRACT

A circuit board processing system has a circuit board fabrication stage configured to fabricate a circuit board having a set of circuit board pads, and a solder fusing stage coupled to the circuit board fabrication stage. The solder fusing stage is configured to (i) apply flux and solder concurrently to the set of circuit board pads, and (ii) activate the flux and melt the solder to form a set of substantially flat solder coatings which is fused to the set of circuit board pads. The circuit board processing system further includes a washing stage coupled to the solder fusing stage. The washing stage is configured to remove contamination from a surface of the circuit board having the circuit board pads and from the set of substantially flat solder coatings which is fused to the set of circuit board pads. Such a system is well-suited for lead-free solder.

21 Claims, 12 Drawing Sheets

CIRCUIT BOARD PROCESSING TECHNIQUES USING SOLDER FUSING

BACKGROUND

A typical circuit board assembly includes a circuit board and circuit board components mounted to the circuit board. In general, the circuit board includes multiple layers of conductive and non-conductive material sandwiched together into a rigid structure that physically supports the circuit board components, as well as provides a network of electrical pathways (i.e., signal traces, power supply signal planes, etc.) that (i) delivers power to the circuit board components and (ii) enables the components to communicate with each other. The circuit board components typically include, among other things, integrated circuit (IC) devices, individual electronic components (e.g., resistors, capacitors, diodes, etc.), and connecting devices (e.g., connectors, optical transducers, etc.).

Although some circuit board components are configured to mount to circuit boards in a press-fit manner (e.g., pins of the component package engage plated-through holes of the circuit boards), many components are configured to mount to circuit boards using solder. One common process for soldering circuit board components to a circuit board utilizes surface mount technology (SMT).

In one conventional SMT process, circuit boards pass horizontally through a series of automated equipment stations. For example, at a first station, automated equipment lowers a stencil on top of a circuit board. The stencil defines apertures that match pads on the surface of the circuit board. Accordingly, when the stencil is properly aligned with the circuit board, the stencil precisely exposes the circuit board pads and covers other circuit board areas that do not have pads. The automated equipment then spreads solder paste directly onto the tops of the circuit board pads (e.g., surface mounted component land patterns) by placing the solder paste on the stencil, and then wiping a squeegee across the stencil to push the solder paste through the apertures and onto the pads. The automated equipment subsequently removes the stencil thus leaving tiny erect bricks of solder paste covering the circuit board pads of the circuit board. As the circuit board moves to the next automated station, the printed solder paste tends to hold its shape and tends to resist slumping due to its thick and binding consistency.

At the next automated equipment station, automated pick and place equipment positions circuit board components on the circuit board. In particular, the automated equipment places SMT contacts of each component in contact with the printed solder paste which is further in direct contact with the circuit board pads.

Next, the circuit board passes through an oven that heats the circuit board, the solder paste, and the circuit board components. As the temperature increases, flux within the paste activates in order to clean both the circuit board pads and the contacts (or metallic interconnects/leads) of the circuit board components, i.e., the flux flows over and chemically reacts with the outer metallic surfaces in order to remove oxidized metal that would otherwise prevent the solder from properly wetting to the circuit board pads and the component contacts. Additionally, solder within the paste melts and reflows. That is, the solder enters the liquid state and wets to both the cleaned top surfaces of the circuit board pads (e.g., a cleaned nickel-gold plating on top of bare copper) as well as the SMT contacts of the circuit board components, e.g., solder balls of a Ball Grid Array (BGA) package, gull wing leads, metal contacts of a ceramic device, etc. Accordingly, after the circuit board exits the oven and cools off, robust and reliable solder joints exist between the circuit board components and the circuit board to rigidly secure the components to the circuit boards. At this point, a reliable electrical pathway exists between each component contact and a corresponding circuit board pad.

Some circuit board designs require components to be mounted to both sides of the circuit board. For such a design, the circuit board is turned over and the opposite side of the circuit board is processed by automated equipment in a similar manner as that described above for the first side of the circuit board.

Finally, a washing station washes the circuit board to remove contaminants. For example, in one type of washing station, automated equipment sprays cleaning solution onto both sides of the circuit board to carry away dirt, debris, flux resides, etc. from the circuit board surfaces. The resulting finished circuit board assembly is now ready for testing and operation.

It should be understood that there are a variety of solders which are presently available to circuit board manufacturers. For example, one type of solder is lead-based. That is, the solder is an alloy that includes a substantial amount of lead (e.g., more than 5%) among other types of metal (e.g., tin, silver, etc.). Manufacturers have found such lead-based solders to be particularly well-suited for forming robust and reliable solder joints between circuit board components and circuit boards. In particular, such lead-based solders tend to wet easily to the surfaces of circuit board pads, e.g., to copper or to nickel-gold plating which often coats the circuit board pads, even in the presence of only a relatively mild flux. Moreover, many lead-based solders are available in a "no-clean" formulation that does not require the manufacturer to subsequently clean (e.g., wash) the circuit boards after the soldering process, thus shortening manufacturing time and reducing manufacturing costs.

Some conventional circuit board manufacturing approaches apply lead-based solder to copper circuit board pads using a process called a Hot Air Solder Leveler (HASL) process prior to circuit board assembly. The HASL process involves vertically immersing a circuit board into a flux bath, subsequently vertically immersing the circuit board into a molten lead-based solder bath, and then air knifing away excess molten lead-based solder to leave behind an intermetallic boundary layer over the pad. Due to the varying geometries of the copper circuit board pads (i.e., different sized pads and pitches, pads in different directions, etc.), lumps of lead-based solder and solder shorts would remain on the circuit board without performing the air knifing procedure. The knife air pressure is set to create a flat fine pitch pad and scavenges off the excess lead-based solder leaving copper pads with a thin but strong intermetallic boundary layer. This remaining intermetallic boundary layer is typically within the range of 150 to 250 millionths of an inch thick. The part of the remaining boundary layer that is closest to the copper circuit board pads includes a relative high amount of copper. The middle of the remaining boundary layer includes both copper and the lead-based solder. The top most part of the remaining boundary layer includes mostly lead-based solder but still has copper which existed to hold that lead-based solder in place, i.e., otherwise that lead-based solder would have been blown away by the air knifing procedure.

Another type of solder is lead-free solder. Lead-free solder contains, at most, only trace amounts of lead (e.g., less than 1%) among other alloys (e.g., tin, silver, etc.). Lead-free solders are generally perceived as being more environmentally friendly than lead-based solders since circuit boards manufactured with lead-free solder have one less hazardous element (i.e., lead) that could later contaminate the environment. Lead-free solders are typically not available in a "no-clean" form and thus require cleaning after the soldering process in order to remove contaminants from the surfaces of the circuit board. Without such cleaning, the contaminants may lower the surface insulation resistance (SIR) of the circuit board. In some instances, failure to remove the contaminants may create a "wet battery" effect (i.e., ion migration) between metallic structures of the circuit board (e.g., adjacent pads or traces) eventually resulting in a short between the metallic structures.

SUMMARY

Unfortunately, there are deficiencies to the above-described conventional soldering process in which solder paste is applied directly onto the tops of the circuit board pads (e.g., directly onto a nickel-gold finish which plates bare copper pads). For example, if lead-based solder is used, the circuit board now contains a significant amount of lead and poses a hazard to the environment. As such, significant precautions must be implemented if and when the circuit board is removed from its operating environment (e.g., if the circuit board is ever taken from a customer site for rework, if the circuit board is eventually discarded after becoming obsolete, etc.).

Additionally, the above-described conventional HASL process leaves only an intermetallic boundary layer having a mix of both lead-based solder and copper. Unfortunately, additional lead-base solder applied during circuit board assembly does not wet very well to the intermetallic boundary layer. In particular, the lead-base solder used during circuit board assembly tends to solder satisfactorily to the centers of the circuit board pads since the centers of the circuit board pads tend to have more of the pre-applied lead-base solder with less copper mixed in, but the solder does not wet well to the peripheries of the pads since the peripheries include higher amounts of copper intermingled with the lead-base solder. As a result, after using HASL, the tops of the pads are essentially non-solderable intermetallics. At this point, it is difficult to add solder since the pads do not well to new solder, and it is difficult to remove solder due to the strength of the remaining intermetallics. Moreover, the HASL process is not well-suited for use with lead-free solders that have poorer wetting characteristics to begin with.

Furthermore, if lead-free solder is used in the above-described conventional soldering process in which solder paste is applied directly onto the tops of the circuit board pads (e.g., directly onto a nickel-gold finish which plates bare copper pads), the manufacturer must take significant steps to ensure that the solder joints are well-formed and that the circuit board is well-cleaned. In particular, very harsh flux chemistries are often required to properly clean the circuit board pads of circuit boards when lead-free solder is used. Otherwise, the lead-free solder will not wet properly to the circuit board pads and unreliable solder joints will form. Furthermore, the flux chemistries of lead-free solders tend to be harder to remove from the circuit board assemblies after the components are soldered to the circuit boards. That is, the fluxes of lead-free solders tend to be harsher and its associated contaminants (i.e., acids and debris) tend to be more difficult to remove from the circuit board surfaces, e.g., the flux residues become nestled in hard to reach places such as lodged between a BGA package and the circuit board.

Over time, such residues will form a wet-battery effect on the circuit board surface, e.g., ions will migrate between electrical structures having different voltages, thus eventually forming a conductive pathway between the electrical structures. Accordingly, without the capability to extensively clean circuit board assemblies formed using lead-free solder and a harsh flux, the use of lead-free solders may result in a significant number of costly service calls from the field over time (i.e., calls from customer installation sites due to hard-to-identify intermittent shorts and failures) or even a catastrophic event such as a fire caused by a short circuit.

In contrast to the above-described conventional soldering process which involves applying solder paste directly onto the tops of the circuit board pads, embodiments of the present invention are directed to techniques which involve fusing solder to circuit board pads prior to circuit board assembly, i.e., before soldering components to the circuit board. Such techniques rely on the principle that metal alloys have a propensity to wet very well to themselves. Accordingly, if a circuit board has a thin layer of solder fused to its circuit board pads prior to circuit board assembly, the solder used in the circuit board assembly process will easily wet to the circuit board pads resulting in robust and reliable solder joints. Such techniques are well-suited for lead-free solders since (i) lead-free solders can be fused to the circuit board pads using relatively harsh fluxes, (ii) residues from the harsh fluxes can easily be removed from the circuit boards prior to circuit board assembly, and (iii) a milder flux can be used during circuit board assembly to obtain outstanding results.

One embodiment of the invention is directed to a circuit board processing system having a circuit board fabrication stage configured to fabricate a circuit board having a set of circuit board pads, and a solder fusing stage coupled to the circuit board fabrication stage. The solder fusing stage is configured to (i) apply flux and solder concurrently to the set of circuit board pads, and (ii) activate the flux and melt the solder to form a set of substantially flat solder coatings which is fused to the set of circuit board pads. The circuit board processing system further includes a washing stage coupled to the solder fusing stage. The washing stage is configured to remove contamination from a surface of the circuit board having the circuit board pads and from the set of substantially flat solder coatings which is fused to the set of circuit board pads.

Such a system is well-suited for lead-free solder. For example, flux activation and solder melting is capable of being precisely controlled for proper fusing since there are no circuit board components to place any temperature restrictions on the process, e.g., the temperature during the solder fusing stage is capable of being controlled in a slow and methodical manner without concern for damaging any circuit board components. Similarly, the system is well-suited for harsher fluxes which are associated with lead-free solders since, in the absence of the circuit board components, extremely effective measures are capable of being employed to remove flux residues, e.g., there is convenient access to all portions of the circuit boards and no hard-to-clean tight spaces underneath component packages since there are no components present.

Another embodiment of the invention is directed to a stencil assembly for use on a circuit board having a set of circuit board pads. The stencil assembly includes a stencil defining a set of apertures that exposes substantially half of a top surface of each circuit board pad when the stencil is placed over the circuit board. The stencil assembly further includes a frame configured to hold the stencil, and an interface configured to connect the frame to automated equipment which is capable of moving the stencil over the circuit board and subsequently away from the circuit board. Such a stencil is well-suited for delivering solder paste to the circuit board (e.g., using a vapor deposition process) in a well-distributed manner during the solder fusing process.

Yet another embodiment of the invention is directed to a system for making a circuit board module. The system includes a circuit board source configured to provide a circuit board having a set of circuit board pads with a set of substantially flat solder coatings fused to the set of circuit board pads, and a paste printing stage coupled to the circuit board source. The paste printing stage is configured to print paste onto the circuit board. The paste includes flux and solder. The system further includes a temperature control stage coupled to the paste printing stage. The temperature control stage is configured to apply heat to activate the flux and the solder to solder the set of circuit board components to the circuit board. Such a system is well-suited for lead-free solders since the presence of the set of solder coatings fused to the set of circuit board pads improves the solder wetting characteristics of the set of circuit board pads to enable usage of a milder flux in place of relatively harsher fluxes that typically characterize lead-free soldering processes.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the present invention are directed to techniques which involve fusing solder to circuit board pads before circuit board assembly, i.e., prior to soldering components to the circuit board. Such techniques rely on the principle that metal alloys have a propensity to wet very well to themselves. Accordingly, if a circuit board has a thin layer of solder fused to its circuit board pads prior to circuit board assembly, the solder used in the circuit board assembly process will easily wet to the circuit board pads resulting in robust and reliable solder joints. Such techniques are well-suited for lead-free solders since (i) lead-free solders can be fused to the circuit board pads using relatively harsh fluxes, (ii) residues from the harsh fluxes can easily be removed from the circuit boards prior to circuit board assembly, and (iii) a milder flux chemistry can be used during circuit board assembly with outstanding results.

Figure 1:
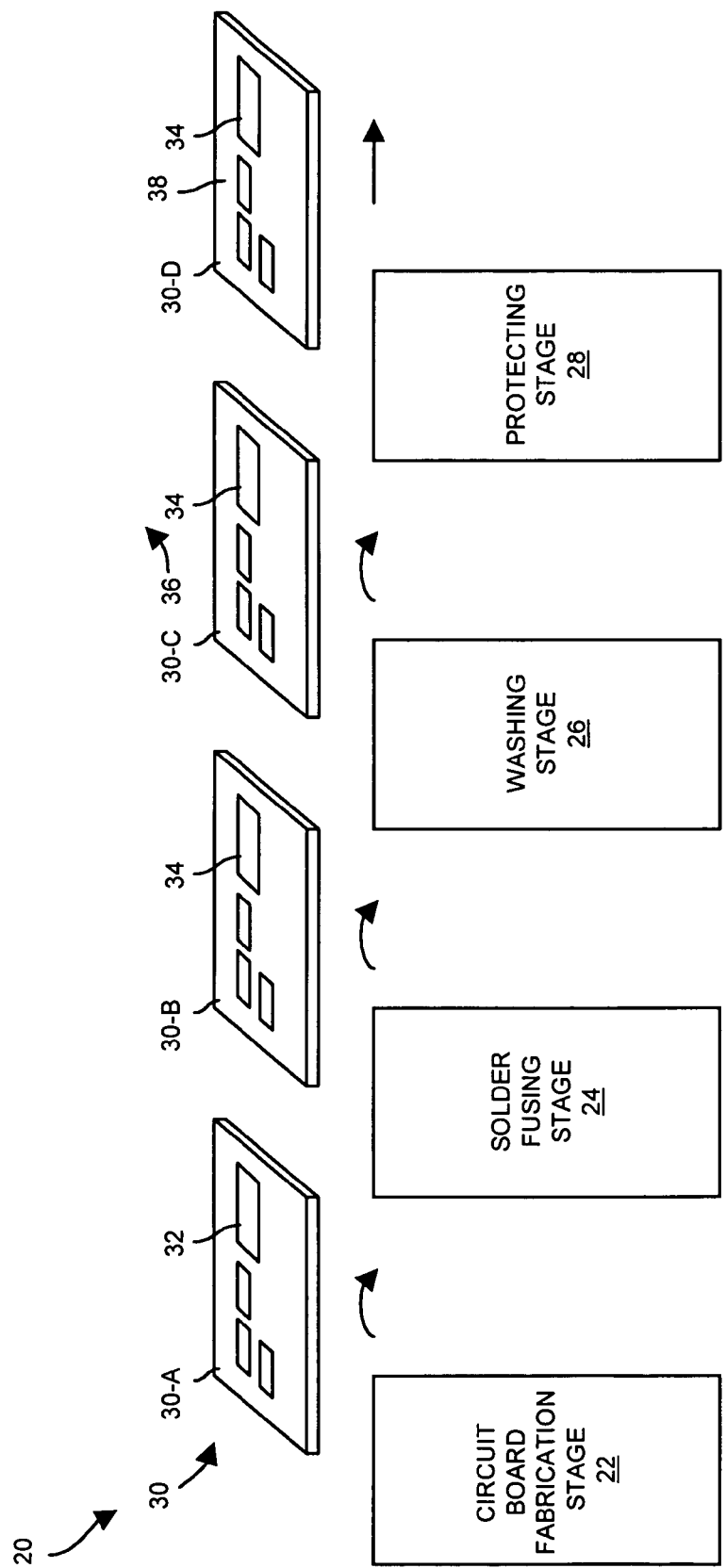
FIG. 1 shows a block diagram of a circuit board processing system which is suitable for use by the invention.

FIG. 1 shows a circuit board processing system 20 which is suitable for use by the invention. The circuit board processing system 20 includes a circuit board fabrication stage (or station) 22, a solder fusing stage 24, a washing stage 26, and a protecting stage 28. During operation, circuit boards 30 pass through the stages 22, 24, 26, 28 in an assembly line or pipelined manner.

The circuit board fabrication stage 22 is configured to provide a circuit board 30, e.g., a rigid planar structure formed by gluing, heating and pressing together layers of non-conductive material (Fiberglass, etc.) and conductive material (e.g., signal planes, copper traces, contacts, etc.). The circuit board 30 includes a set of circuit board pads 32 (e.g., one or more groups of bare copper pads that operate as surface mounting locations for one or more SMT components), and perhaps additional circuit board features (e.g., drilled holes, carved out notches and grooves, etc.). It should be understood that the set of pads 32 of the circuit board 30 (see the circuit board 30-A of FIG. 1) has a general rectangular shape (e.g., when viewed at a distance) even though a closer view would show that the rectangular shape actually includes, as the individual pads 32, metallic structures which are separated from each other by space and non-conductive material (e.g., an array of pads for a BGA component, rows of pads for gull-winged configured components, etc.).

The solder fusing stage 24 is configured to receive the circuit board 30 and fuse a layer of solder to the set of pads 32 (see the circuit board 30-B of FIG. 1). In particular, the circuit board 30 passes through an oven (e.g., a multi-zoned furnace) that activates flux and melts solder within solder paste printed over the set of pads 32. The layer of solder exists as a set of substantially flat solder coatings 34 which is fused to the set of circuit board pads 32. The flatness and uniformity of the soldering coatings 34 facilitates a subsequent solder process during circuit board assembly. As will be explained in further detail shortly, the solder fusing stage 24 is very well-suited for robustly and reliably fusing solder to the pads 32 since the absence of circuit board components enables control of the environment to be unhindered by any component manufacturer requirements, i.e., there are no restrictions placed on temperature, surrounding gases, time exposure, etc. The result is a circuit board 30 with a set of solder fused pads 32 having high wetting characteristics for circuit board assembly, and which does not require any further plating over the set of circuit board pads 32 (e.g., a traditional nickel-gold plating step is no longer needed). Additionally, as will also be explained in further detail shortly, the circuit board 30 is now well-suited for a subsequent circuit board assembly process that uses lead-free solder in combination with a relatively mild flux.

The washing stage 26 of the circuit board processing system 20 is configured to wash the circuit board 30. In particular, the washing stage 26 is configured to apply a cleaner to the circuit board 30 to remove contaminants 36 such as flux residues and stray substances (e.g., dirt, grease, dust, etc.). It should be understood that vigorous exposure of the circuit board 30 to cleaning and rinsing solutions has a very positive cleaning effect on the circuit board 30 since there are no circuit board components to hide particular areas of the circuit board, or to trap contaminants. In one arrangement, the washing stage includes individual tanks that jet cleaning fluid, and subsequently jet rinsing fluid against the circuit board 30 to pry loose and wash away the contaminants 36, e.g., rigorous alkaline-based cleaning fluids and de-ionized water rinses using cascading and sparged defluxing techniques. As a result, the circuit board 30 is in well cleaned state as it exits the washing stage 26 (see the circuit board 30-C of FIG. 1). A washing system which is suitable for use as the washing stage 26 of the circuit board processing system 20 is described in U.S. patent application Ser. No. 10/402,514, entitled "SYSTEMS AND METHODS FOR PROCESSING A SET OF CIRCUIT BOARDS", the teachings of which are hereby incorporated by reference in their entirety.

The protecting stage 28 is configured to provide a protective coating 38 to the circuit board 30. The protective coating 38 shields the surface of the circuit board 30 against further contamination during subsequent storage or shipment prior to circuit board assembly (see the circuit board 30-D). Based on the above-provided description, it should be understood that the pads 32 are essentially pre-fused with solder during fabrication. Further details of the solder fusing stage will now be provided with reference to FIG. 2.

Figure 2:
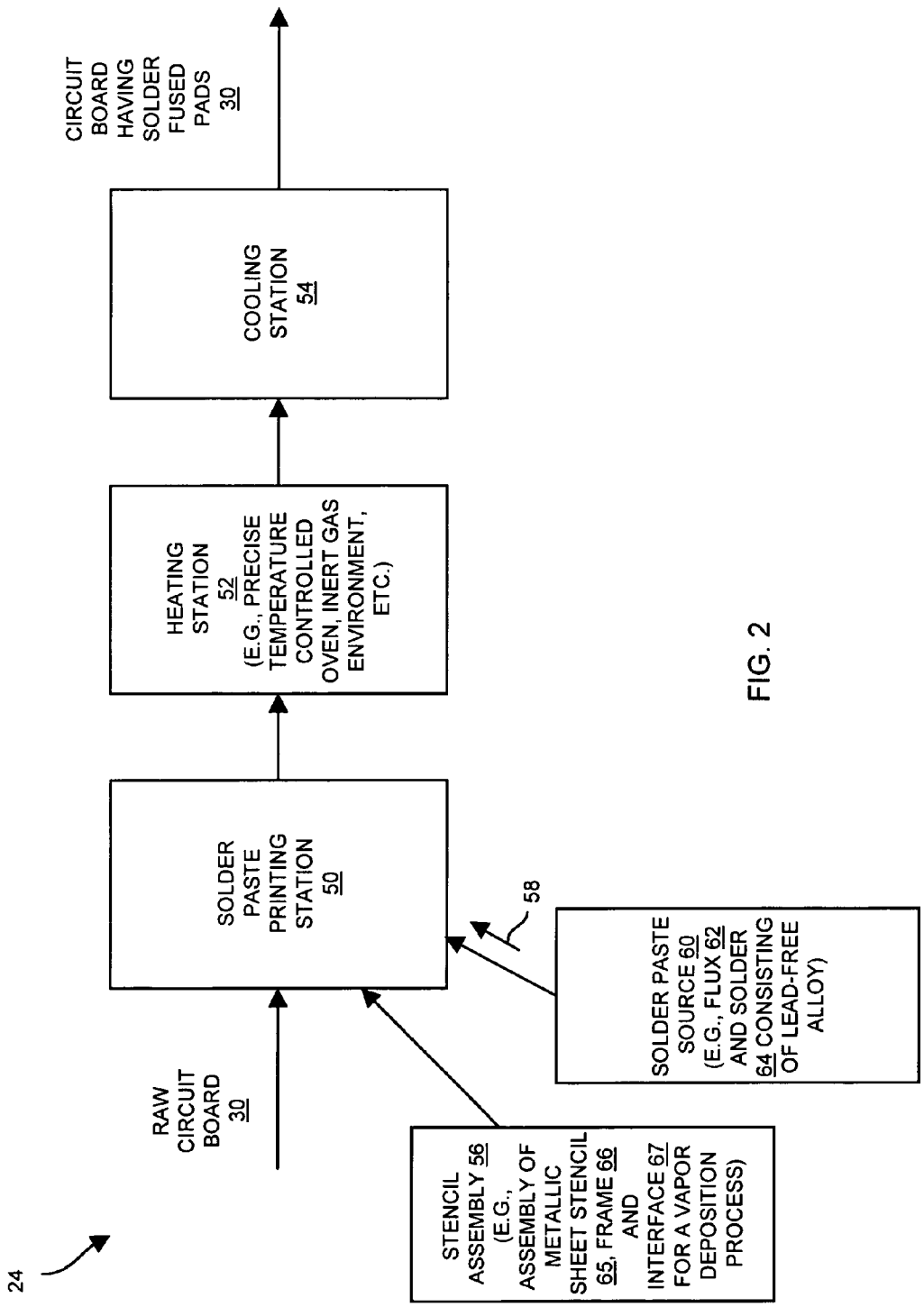
FIG. 2 shows a block diagram of a solder fusing stage of the circuit board processing system of FIG. 1.

FIG. 2 shows a more-detailed block diagram of the solder fusing stage 24 of the circuit board processing system 20. The solder fusing stage 24 includes a solder printing station 50, a heating station 52 and a cooling station 54. The solder printing station 50 is configured to receive a circuit board 30 from the circuit board fabrication stage 22 (also see the circuit board 30-A of FIG. 1), and to print solder over the set of circuit board pads 32 of that circuit board 30 using a stencil assembly 56 and solder paste 58 from a solder paste source 60. The heating station 52 applies heat to the circuit board 30 and to the printed solder paste 58 thus activating flux 62 within the solder paste 58 and melting solder 64 within the solder paste 58. The cooling station 54 then allows the circuit board 30 to cool in a controlled manner.

The stencil assembly 56 includes a metallic sheet stencil 65, a frame 66 and an interface 67. As will be explained in further detail shortly, the stencil 65 defines a set of apertures that exposes only a portion of a top surface of each circuit board pad 32 of the set of circuit board pads 32 when the stencil 65 is properly placed over the circuit board 30. The frame 66 holds the stencil 65 in a taught and steady position. The interface 67 connects the frame 66 to a mounting point, e.g., automated equipment which is capable of moving the stencil 65 of the stencil assembly 56 selectively over the circuit board 30 and subsequently away from the circuit board 30 to process multiple circuit boards 30.

It should be understood that, while the circuit board 30 is at the solder fusing stage 24 (FIG. 1), the solder 64 forms a strong bond with the pads 32 of the circuit board 30. As a result, when the circuit board 30 exits the solder fusing stage 24, a set of substantially flat solder coatings 34 is bound to the set of circuit board pads 32 (also see the circuit board 30-B of FIG. 1).

In some arrangements, the solder paste 58 includes a relatively harsh flux 62 and lead-free solder 64. The harsh flux 62 augments the metallic oxide removal process to improve wetting of the lead-free solder 64 to the pads 32. In these arrangements, the solder paste printing station 50 applies the solder paste 58 to the set of pads 32 using the stencil assembly 56. One technique for depositing the solder paste 58 involves the use of a squeegee in a manner similar to that when printing solder paste during a conventional circuit board assembly process. Another technique, which will be explained in further detail with reference to FIGS. 3 through 9, involves depositing the solder paste 58 using a vapor deposition process similar to that used in semiconductor fabrication.

Figure 3:
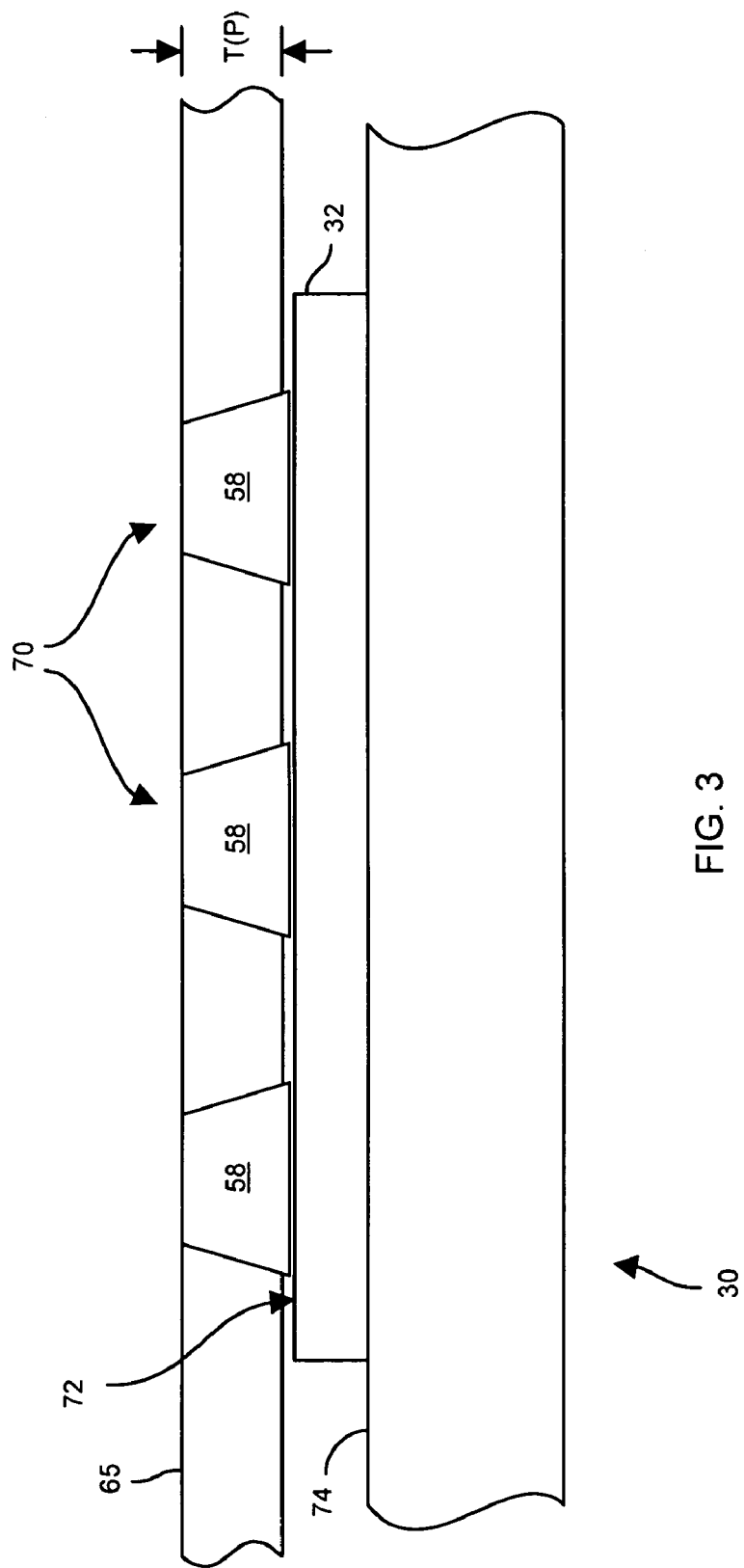
FIG. 3 shows a cross-sectional side view of a circuit board pad and a stencil disposed over the circuit board pad during operation of the solder fusing stage of FIG. 2.
Figure 4:
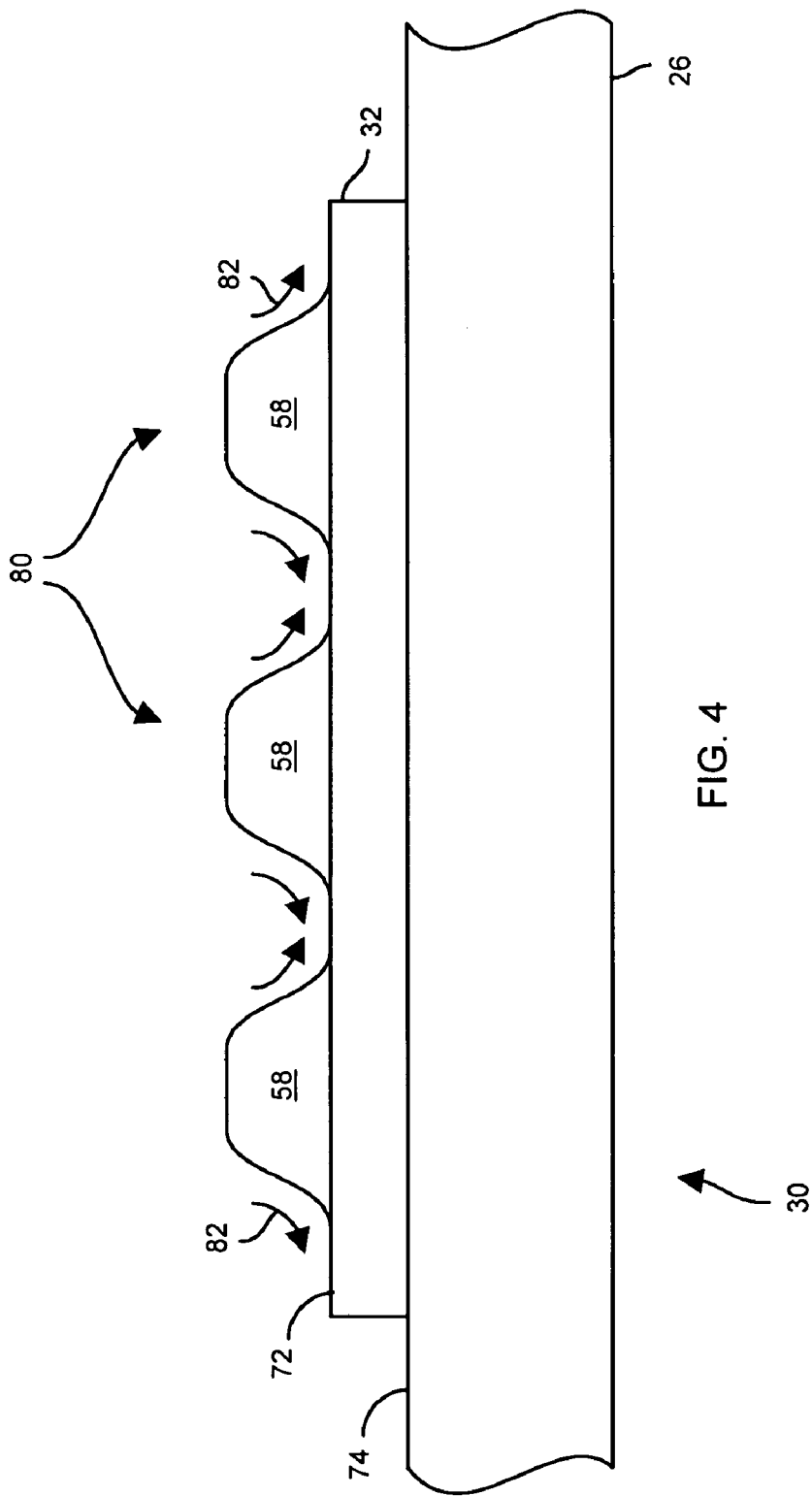
FIG. 4 shows a cross-sectional side view of the circuit board pad of FIG. 3 after the stencil is removed and solder paste is left on top of the circuit board pad.
Figure 5:
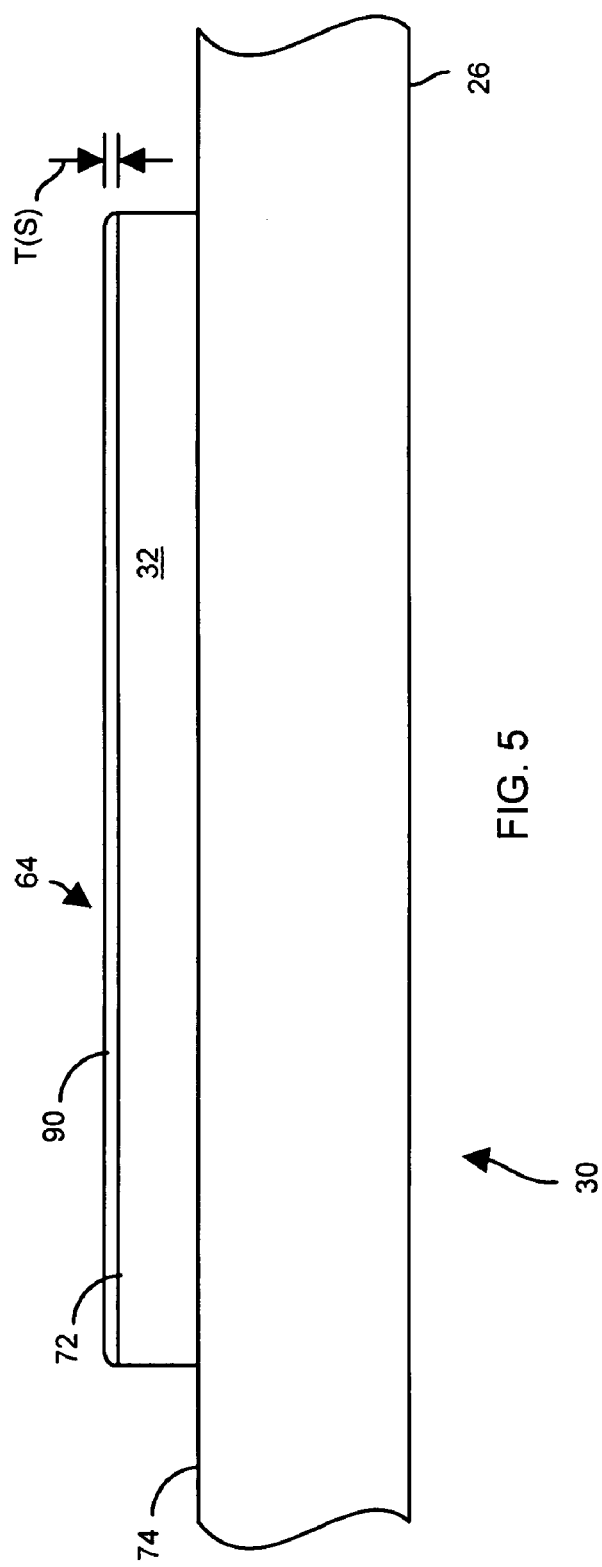
FIG. 5 shows a cross-sectional side view of the circuit board pad of FIG. 4 after heat is applied to activate flux and melt solder in the solder paste to form a substantially flat solder coating which is fused to the circuit board pad.

FIGS. 3 through 5 show a cross-sectional side view of a circuit board pad 32 of the circuit board 30 at various points of the solder fusing stage 24. In particular, FIG. 3 shows a cross-sectional side view of the circuit board pad 32 and a cross-sectional side view of the stencil 65 positioned over the circuit board pad 32. This situation occurs when the stencil 65 is placed over and in proper alignment with the circuit board 30 at the solder printing station 50 (e.g., by automated equipment, by a technician, etc.). As shown, the stencil 65 defines a set of apertures 70 over the top surface 72 of the circuit board pad 32. As will be explained in further detail shortly, each aperture 70 is substantially smaller than the top surface area of the circuit board pad 32, and the arrangement of the apertures 70 distributes the solder paste 58 to particular locations around the top surface 72 for precisely-controlled, even distribution of the solder paste 58 over the top surface 72. The thickness T(P) of the stencil 65 and the size of the apertures 70 of the stencil 65 control the amount of solder paste 58 distributed over the top surface 72 of the pad 32. The stencil sides which define the apertures 70 are preferably slightly tapered to facilitate removal of the stencil 65 without disrupting the solder paste 58.

In one arrangement, the consistency of the solder paste 58 is relatively thin. That is, in contrast to conventional solder pastes which are relatively thick and contain binders in order for the printed bricks of the conventional solder paste to survive the component pick-and-place process during circuit board assembly, the solder paste 58 tends to run and slump excessively in order to spread out over the top surface 72 of the circuit board pad 32. Accordingly, the stencil 65 holds the solder paste 58 in their tapered shapes while the stencil 65 remains in place over the circuit board 30. However, once solder paste printing is complete, the stencil 65 is removed and the solder paste 58 is allowed to slump.

FIG. 4 shows the distributed solder paste 58 in mound formations 80 immediately after the stencil 65 of the stencil assembly 65 is removed. As shown, the mounds 80 of solder paste 58 still resembles the tapered shapes defined by the stencil 65 (FIG. 3). However, the mounds 80 collapse and slump over the top surface 72 of the circuit board pad 32 (see arrows 82).

It should be understood that, unlike solder paste which is printed in larger amounts over each pad during circuit board assembly, the amount of solder paste 58 is small enough that there is little or no risk of the solder paste 58 oozing or running off of the circuit board pad 32 to pose a solder short problem between adjacent metallic surface structures. Rather, the solder paste 58 tends to flatten out over the top surface 72 of the circuit board pad 32. Accordingly, the flux 62 (FIG. 2) within the solder paste 58 is now well-positioned to clean the top surface 72 of the circuit board pad 32.

Next, the circuit board 30 leaves the solder printing station 50 and enters the heating station 52 (also see FIG. 2). The heating station 52 applies heat to both the circuit board 30 and the printed solder paste 58. It should be understood that the heating station 52 is capable of gradually increasing the temperature of the circuit board 30 and the printed solder paste 58 since the circuit board 30 is not undergoing assembly, i.e., there are no circuit board components currently being mounted to the circuit board 30 that would otherwise place restrictions on the amount of heating time and temperature. Rather, the heating station 52 is capable of setting the amount of heating time at each temperature to be precisely what is best for fusing the solder 64 within the solder paste 58 to the circuit board pad 32. For example, the heating station 52 is capable of providing a higher process temperature than would be permissible during the circuit board assembly process. This higher temperature in combination with a more aggressive flux further improves the wetting rate for solder 64 (e.g., tin-silver solder).

In some arrangements, the heating station 52 gradually raises the temperature from ambient room temperature (i.e., the temperature of the manufacturing floor) to the proper activation temperature for the flux 62 within the solder paste 58. In response, the mounds 80 of solder paste 58 slump further (e.g., runs over the circuit board pad 32), and the flux 62 within the solder paste 58 flows over the circuit board pad 32 and robustly cleans the pad 32 (e.g., removes oxidation from the pad 32). Then, the heating station 52 further raises the temperature well into the liquid temperature range for the solder 64 within the solder paste 58 (e.g., 183 to 218 degrees Celsius or other similar SMT temperature ranges) so that the solder 64 melts and easily wets to the pad 32. At this working temperature, which is well above the melting temperature for the solder alloy 64, the solder alloy 64 is most liquidus for a set time. Accordingly, the molten solder alloy 64 flows across the solderable metal surfaces of the pads 32 and fuses to those surfaces. That is, due to the liquidus state of the solder 64 over the well-cleaned circuit board pad 32, the solder 58 robustly attaches with the pad 32 forming a reliable and secure bond. The intermetallic bond between the solder 64 and the pad 32 is particularly well formed when the solder paste 58 is applied to the pad 32 using a vapor deposition process. In one arrangement, the solder alloy is substantially lead-free and the pads 32 are copper-based thus resulting in a healthy intermetallic bond between the lead-free alloy and the copper-based pads 32.

Since there are no circuit board components present during the above-described solder fusing phase, there are no component-related factors that tend to drive down the working temperature or to reduce the amount of time the circuit board 30 remains at the working temperature. That is, the solder fusing process is unhindered by circuit board component limitations since there are no circuit board components present. In contrast, during a typical circuit board assembly process in which circuit board components are mounted to the circuit board, there are limitations placed on the working temperature and the amount of time at the working temperature. These limitations are due to restrictions on the circuit board components caused by factors such as the types of substrate materials used in the circuit board components, the types of component packages, the ratings for silicon junction temperatures, etc.

In one arrangement, the heating station 52 surrounds the circuit board 30 with inert or substantially non-reactive gases (e.g., nitrogen) to facilitate flux operation and to eliminate undesired reactions. For example, in one arrangement, further oxidation is prevented by cutting off the supply of oxygen and various oxygen containing gases to the circuit board 30.

The circuit board 30 then passes into the cooling station 54 which allows the circuit board 30 to cool down and stabilize at a steady lower temperature. Precise cool down control enables maintaining of an optimal grain structure for maintenance of the mechanical properties of the solder fused pads 32. In one arrangement, the cooling station 54 includes cooling devices that provides an environment that is cooler than the ambient room temperature to facilitate removal of heat from the circuit board 30. In another arrangement, the cooling station 54 simply provides circulation (e.g., a fan assembly and filter) to bring the temperature of the circuit board 30 down more gradually.

FIG. 5 shows the solder 64 remaining from the solder paste 58 fused to the top surface 72 of the circuit board pad 32. Here, the solder 64 is back in the solid state and forms a substantially flat solder coating 90 which is fused to the pad 32 (also see the set of substantially flat coatings 34 of FIG. 1). A healthy intermetallic bond now exists along the top surface of the pad 32 for good physical and electrical connectivity.

In some arrangements, the apertures 70 expose substantially 50% of the top surface 72 of the circuit board pad 32, the stencil 65 is substantially 2.0 mils in thickness (0.002 inches thick), and the solder paste 64 has substantially 50% solder by volume (the remaining 50% of the solder paste volume being flux and slumping/thinning agents). As a result, before solder paste activation, the solder paste 58 tends to spread out and roughly form a 1.0 mil thick layer of solder paste 58 over the top surface of the pad 32. After the flux 62 activates and the solder 64 melts, a substantially flat solder coating 90 which is substantially 0.5 mils in thickness T(S) remains fused to the pad 32. This 0.5 substantially flat coating 90 (also see the coatings 34 in FIG. 1) is roughly 2 to 3 times the thickness of the intermetallic boundary layer thus leaving a healthy amount of substantially pure solder (i.e., solder without copper from the pad 30) over the boundary layer which wets extremely well to new solder during the circuit board assembly process. Accordingly, the soldering result during circuit board assembly which is provided by the fused solder coating 90 is superior to that obtained by a pad treated by the earlier-described conventional HASL procedure which tends to leave only non-solderable intermetallics behind on the pads. With solder fusing of embodiments of the present invention, solder thickness and flux activity is easily controlled by the stencil geometry. There is no need for the harsher less controllable use of air knives. As a result, the solder fusing process that creates the coating 90 (FIG. 5) tends to be cleaner with less out-gassing, less voids and is flatter that results of the conventional HASL procedure.

The apertures 70 defined by the above-described 2.0 mil thick stencil 65 are capable of being formed using an etching process. Such a process is well-suited for precisely locating and shaping each aperture 70.

It should be understood that, although it is extremely unlikely, it is possible that some solder 64 attaches to the side of the circuit board pad 32. However, if this happens, it should be understood that the surface tension of the solder 64 (when liquidus) and the amount of solder 64 on the entire pad 32 is so small, it is unlikely that the solder 64 on the side of the pad 32 will pose a concern.

The circuit board 30 is now ready to exit the solder printing stage 24 and to enter the washing stage 26 (also see the circuit board 30-B of FIG. 1). It should be understood that the circuit board 30 still does not have any circuit board components mounted on its surface. Accordingly, the washing stage 26 is extremely effective since there is little or no place for contaminants 36 to hide. For example, there are not hard-to-reach spaces such as the mounting location between a BGA package and the circuit board 30. Rather, every location on the circuit board 30 is exposed. As a result of such open access, the manufacturer is not restricted as to the type of flux 62 used in the previous solder fusing stage 52 (FIG. 2). Rather, during solder fusing, the manufacture is at liberty to use a relatively harsh flux that would normally pose a contamination problem if used during circuit board assembly since the circuit board 30 is completely exposed for easy removal of the flux residues. That is, the manufacturer is capable of using a more chemically aggressive flux that leaves more ionic conductive residues on the circuit board 30 due to the efficiency and effectiveness of the washing stage 26 in removing such residues. The resulting circuit board 30 has extremely low levels of background residues.

Moreover, even if some contamination still existed (e.g., a contaminant survived the washing and rinsing processes because it is tightly locked in place), once circuit board assembly is complete, that contamination would have been exposed to two soldering processes (i.e., the solder fusing process and the circuit board assembly process). Accordingly, it is highly likely that the contamination has been cross-linked and/or securely contained and thus rendered harmless. Thus, such contamination does not pose a threat to degrading the surface insulation resistance (SIR) of the circuit board 30.

As mentioned above in connection with FIG. 1, the protecting stage 28 then coats the cleaned circuit board 30 with a protective coating to preserve its clean state (see the circuit board 30-D). The circuit board 30 is now well-suited for a subsequent circuit board assembly process since any new solder will wet well to the solder fused pad 32. Further details of the stencil 65 and the solder fusing process will now be provided with reference to FIGS. 6 through 9.

The stencil 65 is preferably metallic and capable of withstanding multiple uses in a vapor deposition process similar to that used in semiconductor fabrication in which a mask is positioned over a semiconductor wafer (e.g., silicon) and particles are deposited onto particular locations of the wafer through holes in the mask. Here, the solder paste 58 travels in a vapor-like state and collects within the apertures 70 defined by the stencil 65. These minute amounts of solder paste 58 enter the apertures 70 and contact the top surface 72 of the circuit board pad 32 in a highly reactive state thus facilitating integration of the solder 64 with the top surface 72 of the pad 32. The solder printing station 52 then removes excess solder paste 58 from the stencil 65 to precisely control the amount of the solder deposited on the pad 32.

Figure 6:
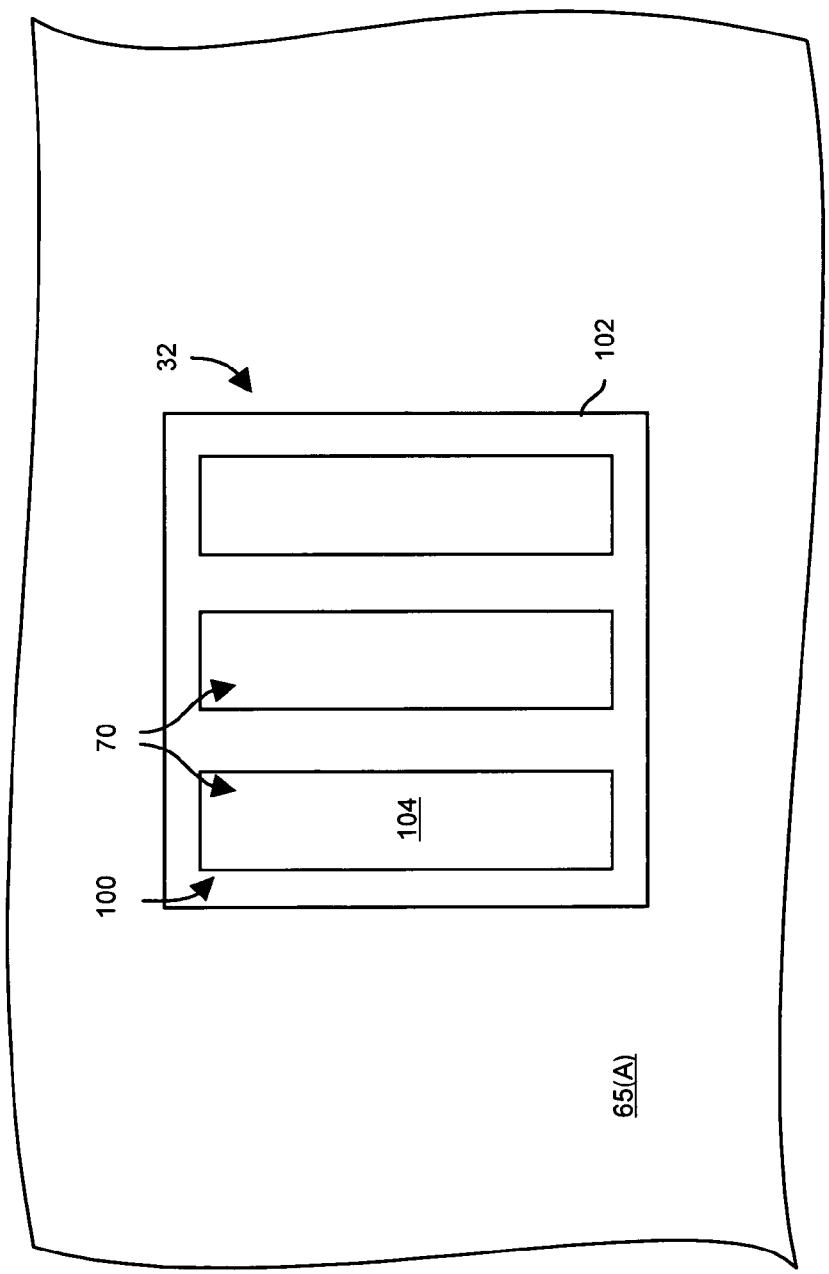
FIG. 6 is a top view of a circuit board pad and a stencil when the stencil has a first aperture configuration.

FIG. 6 shows a top view of a circuit board pad 32 and a first configuration 100 for the stencil aperture 70 when the stencil 65 is properly aligned over the circuit board 30 (see the stencil labeled 65(A) in FIG. 6). The profile 102 of the circuit board pad 32 is shown as a dashed line since the pad 32 is underneath the stencil 65. For the first configuration 100, the apertures 70 have a substantially rectangular shape 104 and the apertures 70 are spaced relatively evenly across the pad 32. Accordingly, there is a substantially uniform distribution of the solder paste 58 over the pad 32 with no crowning, and no puddling in the middle of the pad 32. Furthermore, the presence of multiple apertures over each pad 32 neutralizes and balances pull back forces that could otherwise swing or throw the solder 64 into an awkward or disadvantageous location. The apertures 70 are slightly offset from the edges of the pad 32 (e.g., substantially 10 mils from the edge) in anticipation of the solder paste 58 spreading out over the initially unexposed areas of the pad 32, as well as to prevent the solder paste 58 from falling off the pad 32 when the stencil 65 is removed.

Figure 7:
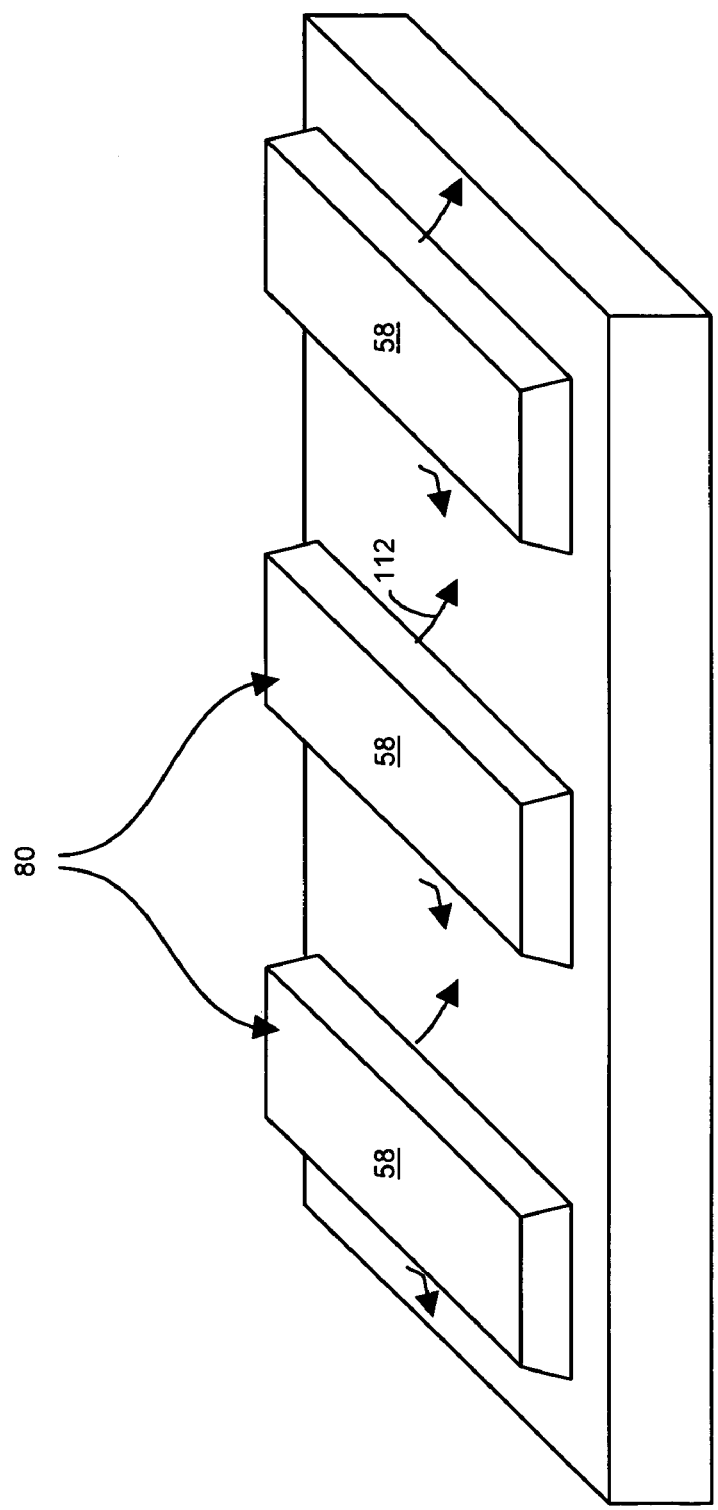
FIG. 7 is a perspective view of the circuit board pad and solder paste left after the stencil having the first aperture configuration is removed.

FIG. 7 shows a perspective view of the mounds 80 of solder paste 58 of FIG. 6 when the solder paste 58 resides within the stencil 65 on top of the surface 72 of the pad 32 and immediately after the stencil 65 is removed. The mounds 80 have substantially rectangular shapes 110 which begin to collapse after the stencil 65 is removed (see the arrows 112). As a result, the solder paste 58 evenly flows over the pad 32 for enhanced distribution of the flux 62 and the solder 64 (also see FIG. 4), and the circuit board 30 is ready to pass through the heating station 52 (FIG. 2).

Figure 8:
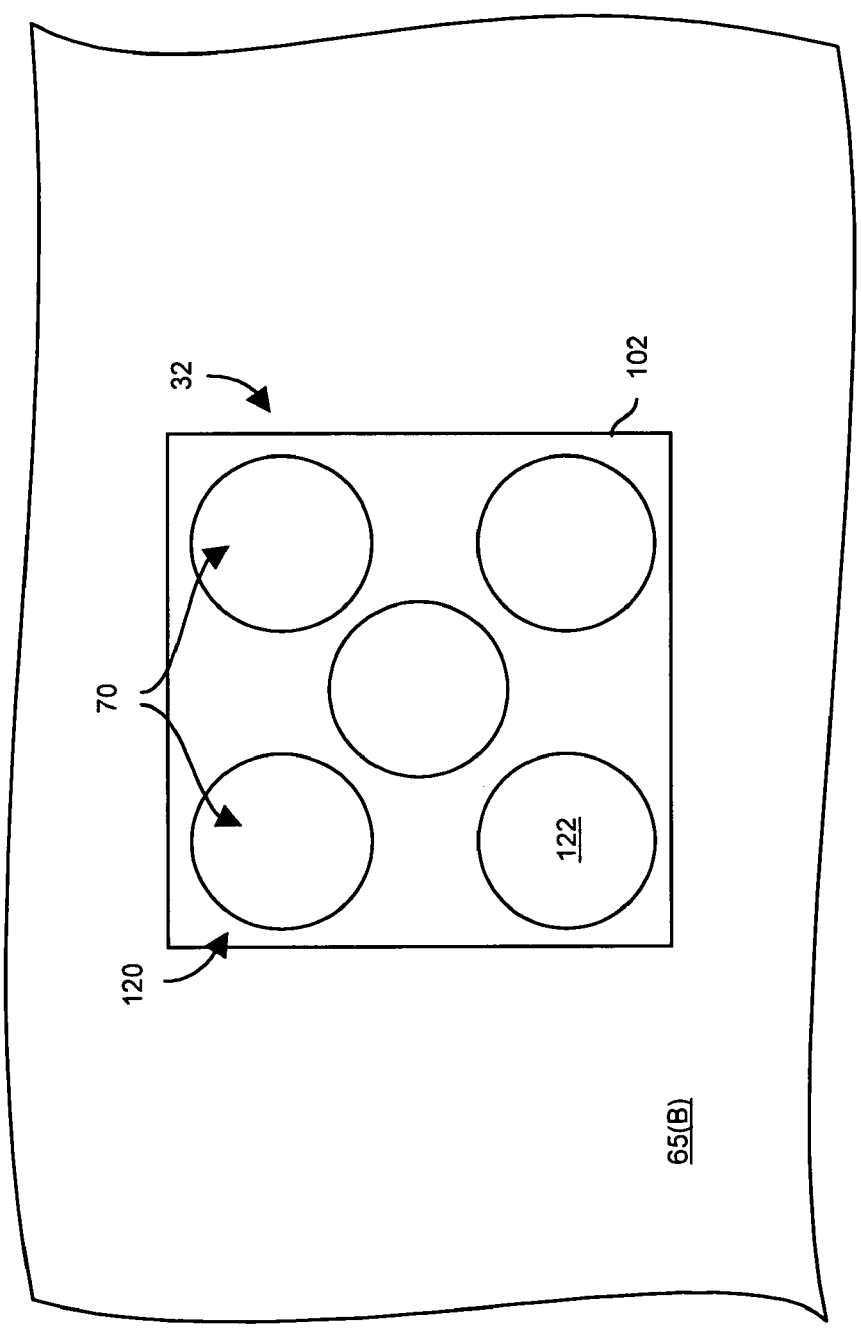
FIG. 8 is a top view of a circuit board pad and a stencil when the stencil has a second aperture configuration.
Figure 9:
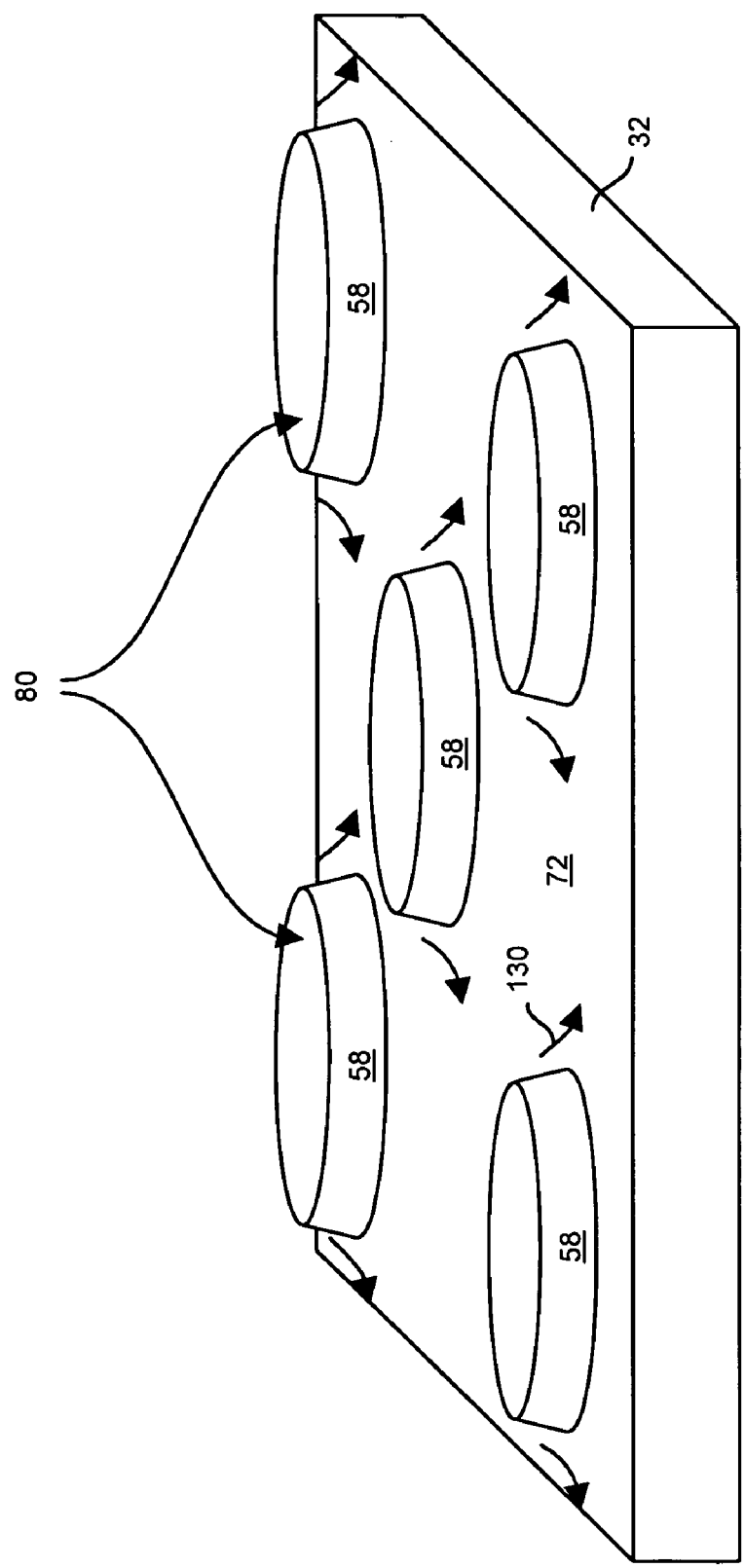
FIG. 9 is a perspective view of the circuit board pad and solder paste left after the stencil having the second aperture configuration is removed.

FIGS. 8 and 9 illustrate the use of a second configuration 120 of stencil apertures 70. FIG. 8 shows a top view of a circuit board pad 32 when the stencil 65 is properly aligned over the circuit board 30 (see the stencil labeled 65(B) in FIG. 8). Since the pad 32 is underneath the stencil 65, the profile 102 of the circuit board pad 32 is shown as a dashed line. For the second configuration 120, the apertures 70 have a substantially circular shape 122 and the apertures 70 are spaced relatively evenly across the pad 32 (e.g., at each corner and at the center of the pad 32). Again, as with the apertures 70 of the first configuration 100 of FIG. 6, the apertures 70 of the second configuration 120 of FIG. 8 are slightly offset from the edges of the pad 32 in anticipation of the solder paste 58 spreading out over the initially unexposed areas of the top surface 72 of the pad 32, as well as to prevent the solder paste 58 from falling off the pad 32 when the stencil 65 is removed.

FIG. 9 shows a perspective view of the mounds 80 of solder paste 58 of FIG. 8 when the solder paste 58 resides within the stencil 65 on top of the surface 72 of the pad 32 and immediately after the stencil 65 is removed. The mounds 80 have substantially disk-like shapes 110 which begin to collapse after the stencil 65 is removed (see the arrows 130). Accordingly, the solder paste 58 evenly flows over the top surface 72 of the pad 32 for enhanced distribution of the flux 62 and the solder 64, and the circuit board 30 is ready to enter the heating station 52 (FIG. 2). Further details of the invention will now be provided with reference to FIG. 10.

Figure 10:
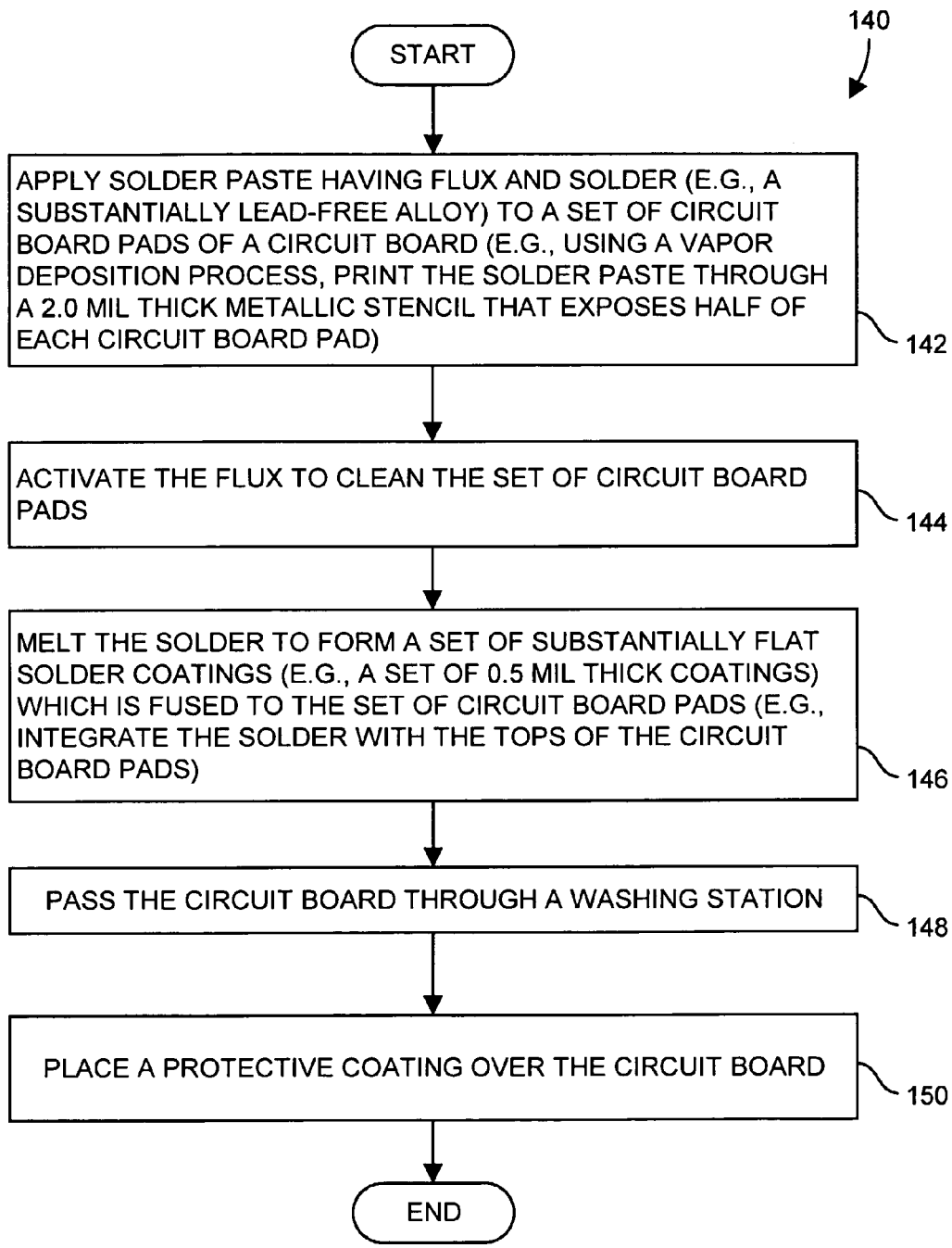
FIG. 10 is a flowchart of a procedure performed by the circuit board processing system of FIG. 1.

FIG. 10 shows a procedure 140 which is performed by the circuit board processing system 20 when processing a circuit board 30. In step 142, the circuit board 30 enters the solder fusing stage 24 of the circuit board processing system 20 (FIG. 1). In particular, the solder paste printing station 50 (FIG. 2) applies solder paste 60 containing flux 62 and solder 64 to the set of circuit board 32. In one arrangement, the solder paste printing station 50 deposits solder paste 58 having, as the solder 64, a substantially lead-free alloy (e.g., tin-silver) through the stencil 65 using a vapor deposition process. When the aperture configurations 100 and 120 of FIGS. 6 and 8 are used, the solder paste 58 prints through a substantially 2.0 mil thick stencil 65 that substantially exposed 50% of the top surface 72 of each pad 32.

In step 144, the heating station 52 (FIG. 2) increases the temperature of the circuit board 30 and the printed solder paste 58 to activate the flux 62 within the solder paste 58. Accordingly, the flux chemically reacts with any oxidized metal on the top surface 72 of the pad 32 thus de-oxidizing the pad 32 and improving its wettability for solder.

In step 146, the heating station 52 continues to increase the temperature of the circuit board 30 and the printed solder paste 58 until the temperature is well into the liquidus working temperature range for the solder 64. At this point, the flux 62 volatizes and the solder 64 melts to form a robust intermetallic bond between the solder 64 and the pad 32. After the circuit board 30 cools at the cooling station 54 (FIG. 2), a set of substantially flat solder coatings 90 remains attached to the set of circuit board pads 32 (FIG. 5, also see the set of solder coatings 34 in FIG. 1).

In step 148, the washing stage 26 cleans the circuit board 30 to remove contaminants 36 (e.g., flux residues, dirt, grease, etc.) that could otherwise lower the SIR of the circuit board 30. In one arrangement, jets of cleaning and rinsing fluid are shot at the circuit board 30 to dislodge and carry away the contaminants 36 (FIG. 2).

In step 150, the protecting stage 28 places a protective coating 38 over the outer surface of the circuit board 30 to preserve the circuit board 30 in its cleaned state. In one arrangement, the coating 38 seals out gases that could otherwise attempt to react with exposed metallic surfaces of the circuit board 30. At this point, the circuit board 30 is ready for storage, transportation or circuit board assembly.

It should be understood that the above-described solder fusing techniques provide extremely good results. In particular, the solder coatings 34 (FIG. 1) are capable of being very flat to promote excellent solder paste and component placement during circuit board assembly. Additionally, a precise amount of solder (e.g., 2 to 3 times the thickness of the intermetallic boundary layer) is left over the pads 32 for robust wetting during the circuit board assembly process due to the configuration of the apertures 70 defined by the stencil 56. These results are in many ways superior to a conventional hot air solder leveler (HASL) process, in which hot air knives blow away solder attached to SMT pads while the solder is molten, because the HASL process tends to blow all of the solder away until only the intermetallic boundary layer is left which typically does not wet well to solder. Without the hot air knife procedure in HASL, the remaining solder would be lumpy and likely short pads together due to there being too much solder on certain pads since circuit board geometries typically include many different angles and shapes. Further details of the invention will now be provided with reference to FIGS. 11 and 12.

Figure 11:
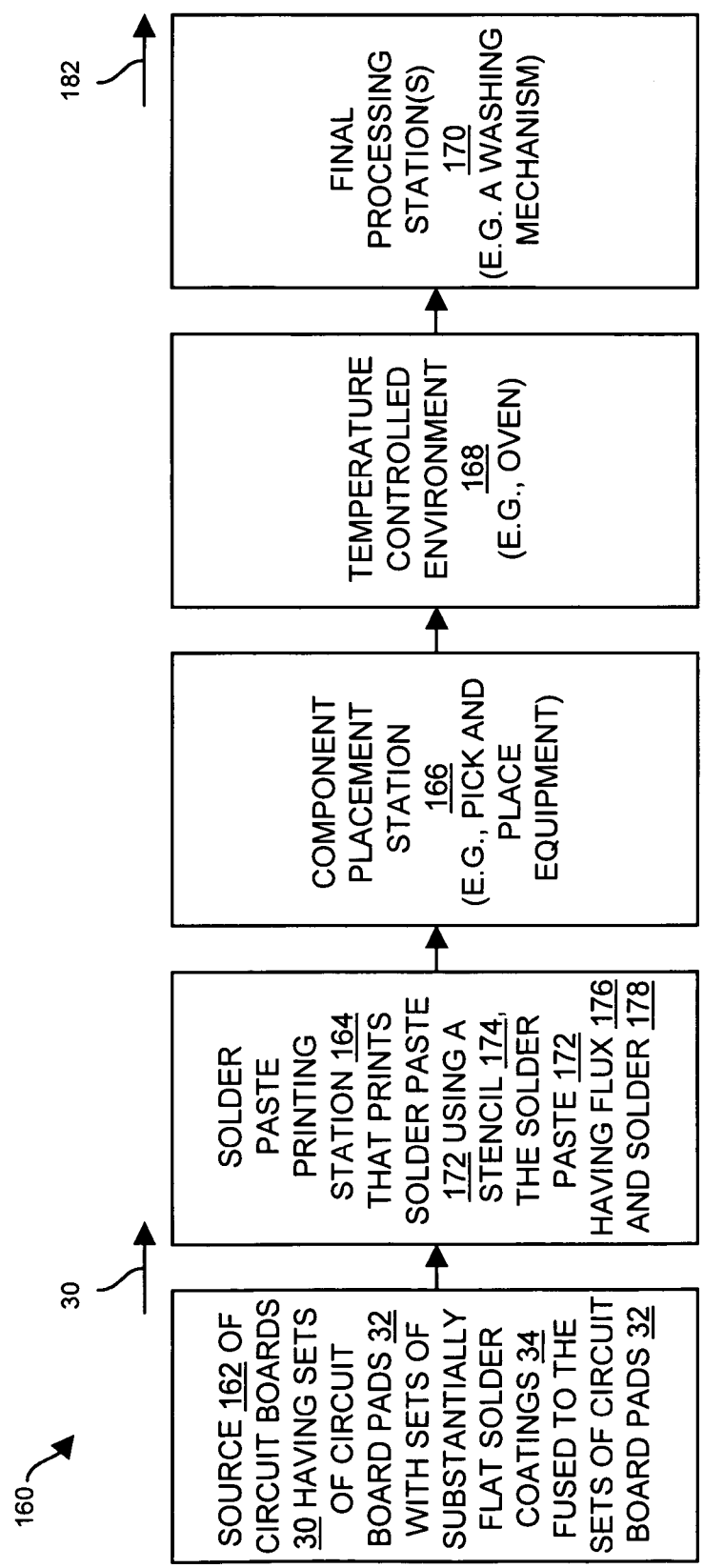
FIG. 11 is a block diagram of a circuit board assembly system which is suitable for use by the invention.

FIG. 11 is a block diagram of a circuit board assembly system 160 which is suitable for use by the invention. The circuit board assembly system 160 includes a circuit board source 162, a paste printing station 164, a component placement station 166, a temperature controlled environment 168 and a final processing station 170. During operation, circuit boards 30 pass through the stages 162, 164, 166, 168, 170 in a conveyor-like or pipelined manner.

The circuit board source 162 provides a circuit board 30 having a set of circuit board pads 32 and a set of substantially flat solder coatings 34 fused to a set of circuit board pads 32. The above-described circuit board processing system 20 (FIG. 1) is an example of such a source 162.

Next, the paste printing station 164 prints solder paste 172 over the set of substantially flat solder coatings 34 using a stencil 174 having holes that closely match the shapes of the pads 32. The solder paste 172 includes flux 176 and solder 178, and has a thick consistency that inhibits slumping, thus enabling the printed solder paste 172 (e.g., bricks of solder paste 172) to substantially maintain its shape after the stencil 174 is removed. In some arrangements, the solder 176 is substantially the same alloy (e.g., lead-free such as tin-silver) as the solder 64 used in the solder fusing process (also see FIG. 2) so that the solder 64 promotes wetting of the solder 178 to the pads 32. Furthermore, in some arrangements, the flux 176 is milder than the flux 62 used in the solder fusing process so there is less difficulty removing flux residue from the circuit board 30 after components are soldered to the circuit board 30.

Then, the component placement station 166 positions circuit board components 180 (e.g., ICs, individual electronic devices, connectors, etc.) over the pads 32 and in contact with the printed solder paste 172. For example, automated pick-and-place equipment precisely locates the components at particular mounting locations of the circuit board 30.

Subsequently, the temperature controlled environment 166 heats the circuit board 30, the newly printed solder paste 172 and the components 180. As a result, the flux 176 activates and cleans the metallic surfaces of the circuit boards 30 (e.g., the solder fused pads 32), and the solder 178 melts to form solder joints between the contacts of the components 180 (e.g., solder balls, gull wing leads, etc.) with the solder fused pads 32. It should be understood that the solder coatings 34 on the tops of the pads 32 also melts and combines with the liquidus solder 178 in the form of robust solder joints. Since liquidus metal alloys attract and wet well to themselves, the molten solder 178 of the newly printed solder paste 172 easily mixes and integrates with the molten solder 64 of the solder coatings 34 even if the flux 176 is mild relatively mild, e.g., even if the solder 178 is lead-free solder but the flux 176 has a strength which is more appropriate for lead-based solders.

Next, the final processing station 170 performs additional processing steps on the circuit board to place it into or closer to operating condition (e.g., washing and drying the populated circuit board 30). In one arrangement, the final processing station 170 includes a washing mechanism that cleans and rinses the circuit board 30 with cleaning and rinsing fluids to remove any contaminants (e.g., flux residues) from the circuit board assembly process. If the flux 176 is relatively mild, the washing mechanism will have no trouble cleansing the circuit board 30 of contaminants that would otherwise pose a threat to the circuit board during operation. The end result is a well-soldered and well-cleaned circuit board module 182 which is ready for operation. A suitable washing mechanism for the final processing station 170 is described in earlier-mentioned U.S. patent application Ser. No. 10/402,514, entitled "SYSTEMS AND METHODS FOR PROCESSING A SET OF CIRCUIT BOARDS", the teachings of which are hereby incorporated by reference in their entirety. Further details of the invention will now be provided with reference to FIG. 12.

Figure 12:
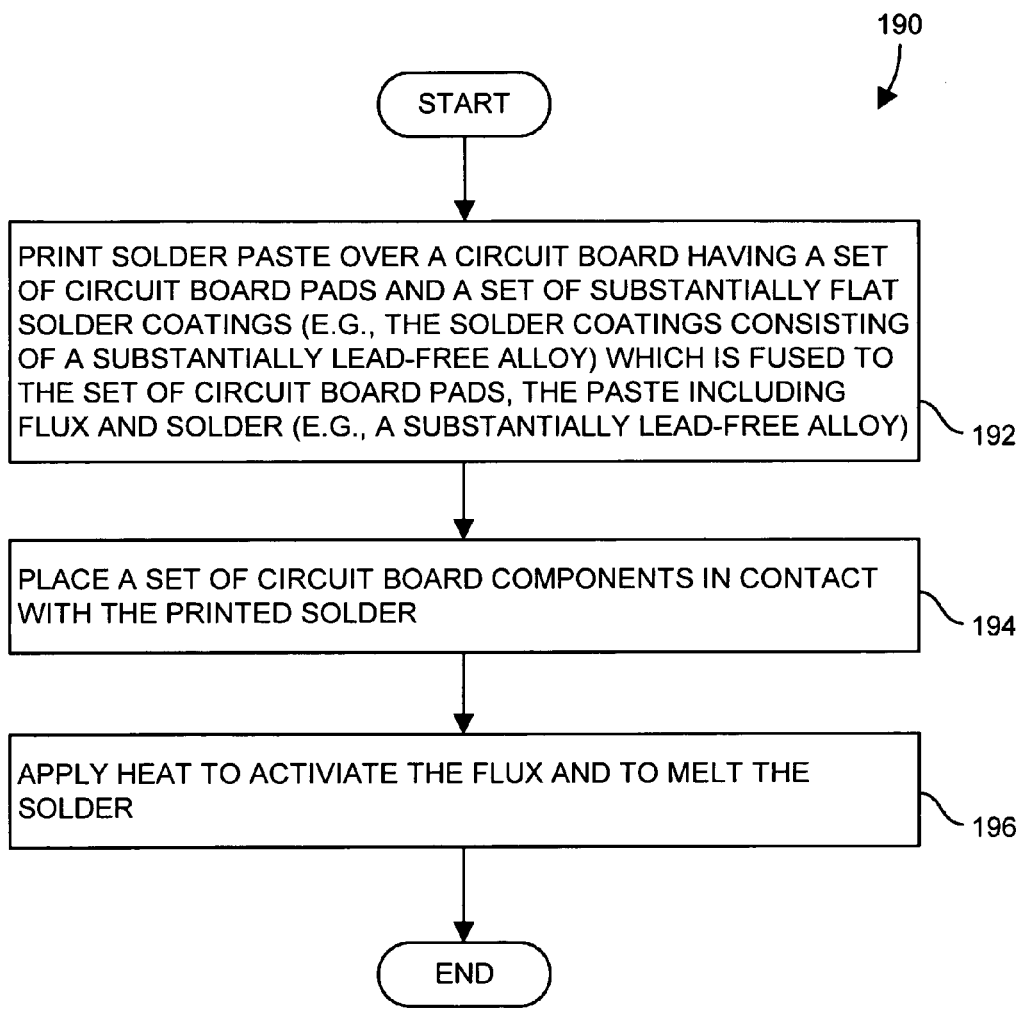
FIG. 12 is a flowchart of a procedure performed by the circuit board assembly system of FIG. 11.

FIG. 12 is a flowchart of a procedure 190 performed by the circuit board assembly system 160. In step 192, the circuit board assembly system 160 prints solder paste 172 over a circuit board 30 having a set of circuit board pads 32 and a set of substantially flat solder coatings 34 fused to the set of circuit board pads 32. The lack of lumps and relative flatness of the solder coatings 34 enables proper application of the solder paste 172 and components during circuit board assembly. As mentioned above, in some arrangements, the solder paste 172 has a relatively thick consistency which resists slump. In some arrangements, the solder 176 is substantially a lead-free alloy which matches solder of the solder coatings 34, and the flux 176 is relatively mild, thus improving soldering results and enabling effective removal of contaminants after the soldering process. The absence of a lead-based solder makes the circuit board 30 more environmentally safe (e.g., during rework, when later disposed of, etc.).

In step 194, the circuit board assembly system 160 places a set of circuit board components 180 in contact with the printed solder paste 172. Since the solder paste 172 is configured to inhibit slumping, the solder paste 172 tends to hold together between the solder fused pads 32 and the contacts of the components 180.

In step 196, the circuit board assembly system 160 applies heat to activate the flux 176 and melt the solder 178 within the solder paste 172. Accordingly, the flux 176 robustly cleans the exposed metallic surfaces, and the solder 178 merges with the solder 64 of the solder coatings 34 over the pads 32 to form a set of robust and reliable interconnects between the pads 32 and the contacts of the components 180.

The procedure 190 is particularly well-suited for use with lead-free solders. That is, even though lead-free solders by definition, have a reduced wetting rate vis-à-vis tin-lead solders, the soldering results of the circuit board assembly system 160 which uses circuit boards 30 having solder fused pads 32 provides outstanding soldering results.

As mentioned above, embodiments of the invention are directed to techniques which involve fusing solder 64 to circuit board pads 32 of a circuit board 30 before circuit board assembly, i.e., prior to soldering components 180 to the circuit board 30. Such techniques rely on the principle that metal alloys have a propensity to wet very well to themselves. As a result, if a circuit board 30 has a thin layer of solder 64 fused to its circuit board pads 32 prior to circuit board assembly, the solder 64 used in the circuit board assembly process will easily wet to the circuit board pads 32 resulting in robust and reliable solder joints. Such techniques are well-suited for lead-free solders since (i) lead-free solders can be fused to the circuit board pads 32 using relatively harsh fluxes 62, (ii) residues from the harsh fluxes 62 can easily be removed from the circuit boards 30 prior to circuit board assembly, and (iii) a milder flux 176 chemistry can be used during circuit board assembly with outstanding results.

While this invention has been particularly shown and described with references to preferred embodiments thereof, it will be understood by those skilled in the art that various changes in form and details may be made therein without departing from the spirit and scope of the invention as defined by the appended claims.

For example, the circuit board processing system 20 was described above as being well-suited for using a vapor deposition procedure for depositing the solder paste 58. It should be understood that other solder paste application processes are also well-suited for use by the circuit board processing system 20 such as anodic plating, horizontal hot air leveling, ionic implantation/bombarding, electroplating with heat to control proper metal mixture richness, etc.

Additionally, Tin-Silver solder (e.g., substantially 95% Tin and 5% Silver, or substantially 96.5% Tin and 3.5% Silver, etc.) was provided above as an example of a lead-free solder alloy 64, 178 which is suitable for use by the circuit board processing system 20 and the circuit board assembly system 160. It should be understood that other lead-free solder alloys 64, 178 are suitable for use as well such as Tin-Silver-Copper combinations (e.g., Sn3.8Ag0.7Cu), Tin-Silver (e.g., Sn3.5Ag), Indium-Silver (e.g., 90% Indium and 10% Silver), substantially pure tin, other high temperature solders, and the like.

It should be understood that, even though, the solder fusing process was described above as being advantageous when using lead-free solders, the solder fusing process is also well suited for use with lead-based solders.

Moreover, it is not a requirement that the solders 64, 178 be identical. To the contrary, the solder alloys 64, 178 may be similar alloys but do not need to be identical. In some arrangements, solder alloy A is used during solder fusing, and solder alloy B is used during circuit board assembly, where solder alloys A and B are different. Preferably the solder alloy 64 used during solder fusing and the solder alloy 178 used during circuit board assembly have a metal in common (e.g., Tin, Silver, Antimony, Lead, etc.).

Furthermore, the flux 62 used in the solder fusing process by the circuit board processing system 20 was described above as typically being stronger than the flux 176 used by the circuit board assembly system 160. A suitable flux 62 for solder fusing is a moderately aggressive acid, rosin-based, water soluble acid flux.

Additionally, the profiles of the circuit board pads 32 where shown as being relatively square by way of example only. In other arrangements, the circuit board pads 32 of the circuit board 30 have other shapes such as rectangular shapes, octagonal shapes, etc.

Furthermore, the circuit board pads 32 were described above as being configured for forming solder joints with a BGA component by way of example only. In other arrangements, the pads 32 are configured to form solder joints with other types of components such as Gull Wing devices, J-Lead devices, etc.

Additionally, the stencil 65 was described above as providing 50% pad coverage by way of example only, i.e., the apertures 70 exposed substantially half of the top surfaces 72 of the circuit board pads 32. In other arrangements, the amount of pad coverage is different such as 65% to 70% pad coverage. Furthermore, it should be understood that, in some arrangements, the amount of coverage for each aperture 72 for a particular pad 32 is the same (e.g., 10%–20%). In other arrangements, the amount of coverage for the apertures 72 for a particular pad is different.

Furthermore, it should be understood that the circuit board processing system 20 was described above as being well-suited for fusing lead-free solder to a circuit board 30 having bare copper circuit board pads 32 in order to improve the circuit board's wetting characteristics for use in a lead-free circuit board assembly system 160. It should be understood that there are other uses for the circuit board processing system 20 as well. For example, the circuit board processing system 20 is well-suited for salvaging circuit boards 30 with potentially bad Ni—Au finishes. That is, fusing solder to the pads 32 after the circuit board pads 32 have been plated with a Nickel-Gold finish (e.g., even if plated poorly) improves the wetting rate of the pads 32 thus making the circuit boards 30 usable in a circuit board assembly process. The amount of solder fused to the pads 32 does not ruin the circuit board 30 for production, and does not massively skew solder volumes.

As another example, the circuit board processing system 20 is well-suited for reducing the risk of forming tin whiskers for pure tin metal finishes. That is, circuit board treatment processes such as an immersed tin process or an electrolyte plating tin finishing process tend to form and grow tin whiskers due to internal stresses resulting from the incompatibility between the lattice structures of tin and the substrate (e.g., copper). Accordingly, the circuit board processing system 20 is capable of fusing tin solder to the pads 32 prior to a subsequent tin finishing process (e.g., an immersed tin process or an electrolyte plating tin finishing process) and thus deterring tin whisker formation. To this end, the fused tin solder on the pads 32 provides a stress relief inside the immersed or plated tin coating. Additionally, the tin finish does not need to directly contact the substrate (which would otherwise tend to drive whisker growth), but rather bonds with the tin solder coating. This provides a more desirable intermetallic layer with an optimized thickness and morphology.

What is claimed is:

1. A circuit board processing system, comprising:
   a circuit board fabrication stage configured to fabricate a circuit board having a set of circuit board pads;
   a solder fusing stage coupled to the circuit board fabrication stage, the solder fusing stage being configured to (i) apply flux and solder concurrently to the set of circuit board pads, and (ii) activate the flux and melt the solder to form a set of substantially flat solder coatings which is fused to the set of circuit board pads; and
   a washing stage coupled to the solder fusing stage, the washing stage being configured to remove contamination from a surface of the circuit board having the circuit board pads and from the set of substantially flat solder coatings which is fused to the set of circuit board pads,
   wherein the solder fusing stage comprises:
      a metallic stencil,
      an applicator operable to apply a paste containing the flux and the solder onto the set of circuit board pads through the metallic stencil, and
      a squeegee operable to remove the paste from the metallic stencil; and
   wherein the circuit board fabrication stage, when fabricating the circuit board having the set of circuit board pads, is configured to glue, heat, and press together layers of non-conductive and conductive material into a substantially rigid planar structure having signal planes, traces, and contacts to form a network of electrical pathways between multiple integrated circuit device packages and a support surface to support the multiple integrated circuit device packages; and
   wherein the circuit board pads are Surface Mount Technology (SMT) pads which are adapted to soldering to integrated circuit packages having SMT package contacts; and wherein the solder fusing stage, when activating the flux and melting the solder to form the set of substantially flat solder coatings which is fused to the set of circuit board pads, is configure to:
      apply high heat to form as the set of substantially flat solder coatings, a set of solderable structures having (i) intermetallic bonds with the set of SMT pads, and (ii) external surfaces with high solder affinity in order to solder to the SMT package contacts of the integrated circuit packages during an SMT circuit board assembly process.

2. The circuit board processing system of claim 1 wherein the solder is a substantially lead-free alloy, and wherein the solder fusing stage is configured to:
   integrate a set of layers of the substantially lead-free alloy with the set of circuit board pads.

3. The circuit board processing system of claim 1 wherein the squeegee of the solder fusing stage is configured as the applicator to:
   print the paste onto the set of circuit board pads through the metallic stencil.

4. The circuit board processing system of claim 1 wherein the paste has a substantially low viscosity, and wherein the solder fusing stage is further configured to:
   remove the metallic stencil to enable (i) the paste to substantially slump and (ii) the flux to flow over the set of circuit board pads.

5. The circuit board processing system of claim 1 wherein the applicator of the solder fusing stage is configured to:
   deposit the paste onto the set of circuit board pads through the metallic stencil using a vapor deposition process.

6. The circuit board processing system of claim 5 wherein the solder fusing stage, when depositing the paste, is configured to:
   provide an amount of the paste on the set of circuit board pads to leave, as the set of substantially flat solder coatings, a solder layer that is substantially 0.5 mils in thickness on the set of circuit board pads.

7. The circuit board processing system of claim 6 wherein the metallic stencil defines a set of apertures to expose substantially half of a top surface of each circuit board pad; and wherein the solder fusing stage, when providing the amount of the paste, is configured to:
   supply the paste through the set of apertures defined by the metallic stencil to cover substantially half of the top surface of each circuit board pad with the paste.

8. The circuit board processing system of claim 7 wherein the solder fusing stage, when supplying the paste through the set of apertures defined by the metallic stencil, is configured to:
   distribute a stack of the paste which is substantially 2.0 mils in height over each circuit board pad.

9. The circuit board processing system of claim 1 wherein the washing stage is configured to:
   remove the contamination from the set of substantially flat solder coatings prior to mounting circuit board components to the circuit board.

10. The circuit board processing system of claim 1, further comprising:
    a protecting stage coupled to the washing stage, the protecting stage being configured to place a protective coating over the circuit board to cover the set of substantially flat solder coatings which is fused to the set of circuit board pads.

11. The circuit board processing system of claim 1 wherein the circuit board fabrication stage is configured to fabricate, as the circuit board having the set of circuit board pads, a printed circuit board structure adapted to solder to multiple circuit board components during the SMT circuit board assembly process.

12. A circuit board processing system, comprising:
    a circuit board fabrication stage configured to fabricate a circuit board having a set of Surface Mount Technology (SMT) circuit board pads;
    a solder fusing stage coupled to the circuit board fabrication stage, the solder fusing stage being configured to (i) apply flux and solder concurrently to the set of SMT circuit board pads, and (ii) activate the flux and melt the solder to form a set of substantially flat solder coatings which is fused to the set of SMT circuit board pads; and
    a washing stage coupled to the solder fusing stage, the washing stage being configured to remove contamination from a surface of the circuit board having the SMT circuit board pads and from the set of substantially flat solder coatings which is fused to the set of SMT circuit board pads,
    wherein the solder fusing stage comprises:
       a metallic stencil,
       an applicator operable to apply a paste containing the flux and the solder onto the set of SMT circuit board pads through the metallic stencil, and a squeegee operable to remove paste from the metallic stencil; and wherein the circuit board fabrication stage, when fabricating the circuit board having the set of circuit board pads, is configured to glue, heat, and press together layers of non-conductive and conductive material into a substantially rigid planar structure having signal planes, traces, and contacts to form a network of electrical pathways between multiple integrated circuit device packages and a support surface to support the multiple integrated circuit device packages.

13. The circuit board processing system of claim 1, wherein the metallic stencil comprises stencil sides that define a set of apertures, the stencil sides being outwardly tapered from a paste application surface of the metallic stencil to an opposing circuit board pad surface of the metallic stencil.

14. The circuit board processing system of claim 1, wherein the metallic stencil defines a set of apertures, the applicator operable to apply two or more mounds of paste to one of the circuit board pads of the set of circuit board pads through the set of apertures defined by the metallic stencil.

15. The circuit board processing system of claim 1, wherein the solder fusing stage comprises a cooling station having a cooling device that provides a substantially steady temperature, less than an ambient room temperature, to the circuit board.

16. The circuit board processing system of claim 12 wherein the squeegee of the solder fusing stage is configured as the applicator to:

print the paste onto the set of circuit board pads through the metallic stencil.

17. The circuit board processing system of claim 12 wherein the applicator of the solder fusing stage is configured to:

deposit the paste onto the set of circuit board pads through the metallic stencil using a vapor deposition process.

18. The circuit board processing system of claim 12, wherein the metallic stencil comprises stencil sides that define a set of apertures, the stencil sides being outwardly tapered from a paste application surface of the metallic stencil to an opposing circuit board pad surface of the metallic stencil.

19. The circuit board processing system of claim 12, wherein the metallic stencil defines a set of apertures, the applicator operable to apply two or more mounds of paste to one of the circuit board pads of the set of circuit board pads through the set of apertures defined by the metallic stencil.

20. The circuit board processing system of claim 12, wherein the solder fusing stage comprises a cooling station having a cooling device that provides a substantially steady temperature, less than an ambient room temperature, to the circuit board.

21. The circuit board processing system of claim 1, wherein the metallic stencil is configured to withstand multiple uses.

* * * * *